US012609173B2

(12) United States Patent
Lee et al.

(10) Patent No.: US 12,609,173 B2
(45) Date of Patent: Apr. 21, 2026

(54) SEMICONDUCTOR MEMORY DEVICE AND METHOD OF OPERATING THE SAME

(71) Applicant: SAMSUNG ELECTRONICS CO., LTD., Suwon-si (KR)

(72) Inventors: Taeyun Lee, Suwon-si (KR); Yohan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 18/507,521

(22) Filed: Nov. 13, 2023

(65) Prior Publication Data

US 2024/0331783 A1 Oct. 3, 2024

(30) Foreign Application Priority Data

Apr. 3, 2023 (KR) ......................... 10-2023-0043309

(51) Int. Cl.
| | |
|---|---|
| *G11C 16/26* | (2006.01) |
| *G11C 7/08* | (2006.01) |
| *G11C 16/10* | (2006.01) |
| *G11C 16/34* | (2006.01) |

(52) U.S. Cl.
CPC ............ *G11C 16/3459* (2013.01); *G11C 7/08* (2013.01); *G11C 16/102* (2013.01); *G11C 16/26* (2013.01)

(58) Field of Classification Search
CPC ..... G11C 16/3459; G11C 7/08; G11C 16/102; G11C 16/26; G11C 2207/2254; G11C 7/22; G11C 16/344; G11C 2211/5621; G11C 16/3454; G11C 16/3436; G11C 7/065; G11C 16/10
See application file for complete search history.

(56) References Cited

U.S. PATENT DOCUMENTS

| | | | |
|---|---|---|---|
| 6,813,214 | B2 | 11/2004 | Cho et al. |
| 2004/0001364 | A1 | 1/2004 | Bhatia et al. |
| 2005/0083735 | A1 | 4/2005 | Chen et al. |
| 2011/0116320 | A1 | 5/2011 | Zhang et al. |
| 2012/0069674 | A1 | 3/2012 | Lee |
| 2014/0056069 | A1 | 2/2014 | Park et al. |
| 2014/0269083 | A1 | 9/2014 | Mui et al. |
| 2014/0340964 | A1 | 11/2014 | Shiino et al. |

(Continued)

FOREIGN PATENT DOCUMENTS

| | | |
|---|---|---|
| KR | 10-0399353 | 9/2003 |

OTHER PUBLICATIONS

Extended European Search Report in European Appln. No. 24166333.5, mailed on Jul. 25, 2024, 10 pages.

*Primary Examiner* — Xiaochun L Chen
(74) *Attorney, Agent, or Firm* — Fish & Richardson P.C.

(57) ABSTRACT

The present disclosure relates to semiconductor memory devices and methods of operating a semiconductor memory device. One example method includes setting a sensing node of a page buffer to a first voltage, detecting a deviation in operating characteristics of a first sense amplifier and a second sense amplifier with respect to the first voltage, and sequentially repeating a first internal operation for at least two different operating times in the first sense amplifier, the second sense amplifier, or the first sense amplifier and the second sense amplifier based on the deviation in operating characteristics of the first sense amplifier and the second sense amplifier.

19 Claims, 14 Drawing Sheets

(56)          References Cited

U.S. PATENT DOCUMENTS

2017/0076812  A1      3/2017  Chu et al.
2017/0125097  A1      5/2017  Tortorelli et al.
2018/0068738  A1*     3/2018  Kato  .................. G11C 16/3459

* cited by examiner

100

S120

SET SENSING NODE OF PAGE BUFFER TO FIRST VOLTAGE

S140

DETECT DEVIATION IN OPERATING CHARACTERISTICS OF
FIRST SENSE AMPLIFIER AND SECOND SENSE AMPLIFIER
WITH RESPECT TO FIRST VOLTAGE

S160

SEQUENTIALLY REPEAT FIRST INTERNAL OPERATION
FOR AT LEAST TWO DIFFERENT OPERATING TIMES

S140

S142

SENSE SENSING NODE IN FIRST SENSE AMPLIFIER

S144

SENSE SENSING NODE IN SECOND SENSE AMPLIFIER

S146

IDENTIFY RANGE OF FORCING REGION

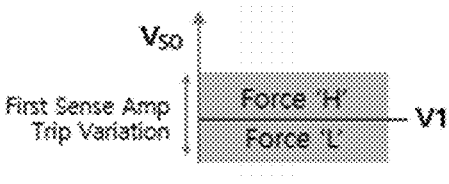
FIG. 9A
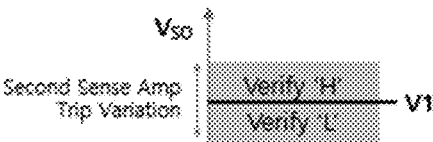
FIG. 9B
| Sensing Result | | Forcing Region |
|---|---|---|
| 254 | 256 | |
| H | H | Default |
| H | L | Small |
| L | H | Large |
| L | L | Default |
FIG. 10

S160

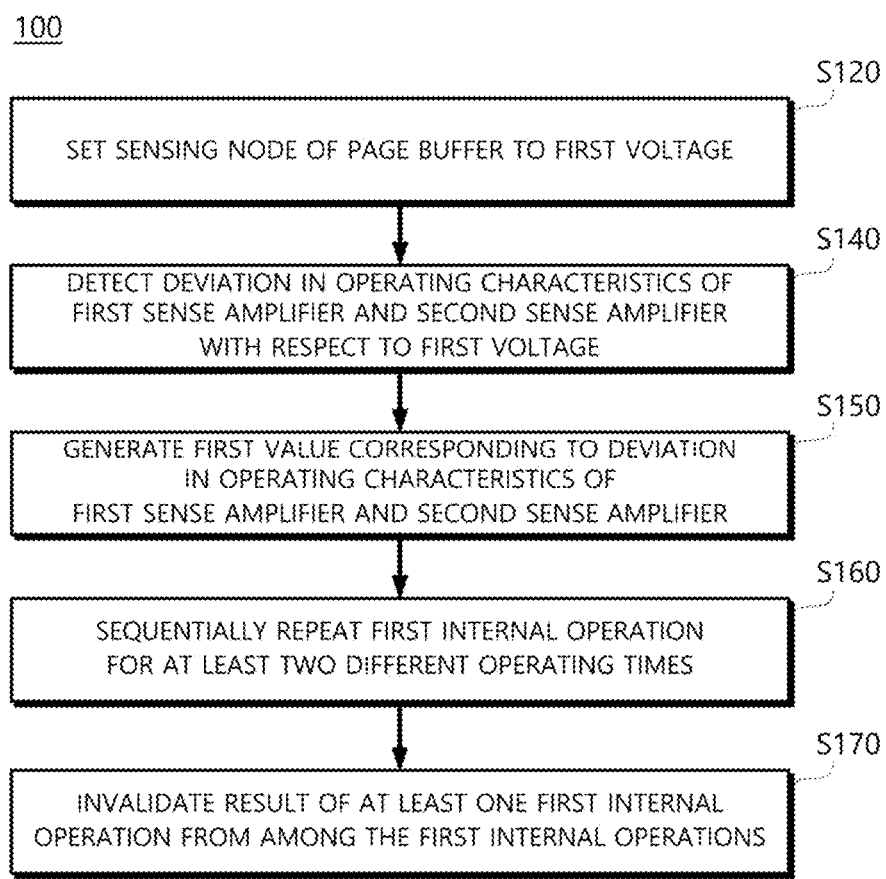

100

S120

SET SENSING NODE OF PAGE BUFFER TO FIRST VOLTAGE

S140

DETECT DEVIATION IN OPERATING CHARACTERISTICS OF
FIRST SENSE AMPLIFIER AND SECOND SENSE AMPLIFIER
WITH RESPECT TO FIRST VOLTAGE

S150

GENERATE FIRST VALUE CORRESPONDING TO DEVIATION
IN OPERATING CHARACTERISTICS OF
FIRST SENSE AMPLIFIER AND SECOND SENSE AMPLIFIER

S160

SEQUENTIALLY REPEAT FIRST INTERNAL OPERATION
FOR AT LEAST TWO DIFFERENT OPERATING TIMES

S170

INVALIDATE RESULT OF AT LEAST ONE FIRST INTERNAL
OPERATION FROM AMONG THE FIRST INTERNAL OPERATIONS

FIG. 14

| Initial | Cell | Reset Sense | Data Processing | Set Sense |
|---------|------|-------------|-----------------|-----------|
| H | Off | L | H | H |
|   | On | H | L | L |
| L | Off | L | L | H |
|   | On | L | L | L |

| 2Group (Wide Care) | | Forcing Region | Δtdev | tdev1 | tdev2 |
|---|---|---|---|---|---|
| Force | Verify | | | | |
| H | H | Default | Default | Default | Default |
| H | L | Narrow | Default | Default | Default |
| L | H | Wide | Default - α | Long | Default |
| L | L | Default | Default | Default | Default |

| 2Group (Narrow Care) | | Forcing Region | Δtdev | tdev1 | tdev2 |
|---|---|---|---|---|---|
| Force | Verify | | | | |
| H | H | Default | Default | Default | Default |
| H | L | Narrow | Default + α | Short | Default |
| L | H | Wide | Default | Default | Default |
| L | L | Default | Default | Default | Default |

| 4Group (All Care) | | Forcing Region | Δtdev | tdev1 | tdev2 |
|---|---|---|---|---|---|
| Force | Verify | | | | |
| H | H | Default | Default | Short | Short |
| H | L | Narrow | Default + α | Short | Default |
| L | H | Wide | Default - α | Default | Short |
| L | L | Default | Default | Default | Default |

FIG. 17

SEMICONDUCTOR MEMORY DEVICE AND METHOD OF OPERATING THE SAME

CROSS-REFERENCE TO RELATED APPLICATION

This application claims benefit of priority to Korean Patent Application No. 10-2023-0043309, filed on Apr. 3, 2023, in the Korean Intellectual Property Office, the disclosure of which is incorporated herein by reference in its entirety.

BACKGROUND

The present disclosure relates to a semiconductor memory device and more particularly, to a semiconductor memory device in which a threshold voltage distribution of memory cells is improved and a method of operating the same.

Recently, integration of a semiconductor memory device has been increased. For example, in case of a vertical NAND (V-NAND) flash memory, the number of layers thereof already exceeds 200. As integration of a semiconductor memory device increases, the effect generated due to a deviation in operating characteristics of sense amplifiers may be significant, wherein the sense amplifier amplifies a voltage of a bit line connected to a memory cell to a signal in a recognizable logic level. For example, errors may be generated in read or verification of data due to a deviation in operating characteristics of each sense amplifier.

SUMMARY

The present disclosure relates to a semiconductor memory device by which a required operation may be accurately performed even if a deviation of operating characteristics exists in sense amplifiers and a method of operating the same.

In some implementations, a method of operating a semiconductor memory device includes: setting a sensing node of a page buffer to a first voltage; detecting a deviation in operating characteristics of a first sense amplifier and a second sense amplifier with respect to the first voltage; and sequentially repeating a first internal operation for at least two different operating times in at least one of the first sense amplifier and the second sense amplifier based on the deviation in operating characteristics of the first sense amplifier and the second sense amplifier.

In some implementations, a method of operating a semiconductor memory device includes: performing a program operation for a memory cell using a plurality of program pulses; performing a program verify operation which verifies a result of the program operation performed using one program pulse by sequentially sensing a sensing node electrically connected to the memory cell for at least 3 times through a coarse sensing amplifier and a fine sensing amplifier included in a page buffer; and setting sensing operation times for the sensing node to be different from each other based on a difference between a trip voltage of the coarse sensing amplifier and a trip voltage of the fine sensing amplifier, before the program verify operation is performed.

In some implementations, a semiconductor memory device comprising a page buffer, wherein the page buffer includes: a sensing node voltage setting unit for applying a first voltage to a sensing node; a coarse sensing amplifier for outputting a first sensing result by sensing the sensing node set to be have the first voltage; a fine sensing amplifier for outputting a second sensing result by sensing the sensing node set to be have the first voltage; and a first data latch for storing a first value corresponding to the first sensing result and the second sensing result.

BRIEF DESCRIPTION OF DRAWINGS

The above and other aspects, features, and advantages of the present disclosure will be more clearly understood from the following detailed description, taken in conjunction with the accompanying drawings.

FIGS. 9A and 9B respectively illustrate example sensing results of a first sense amplifier and a second sense amplifier.

FIG. 10 is an example of a table illustrating a range of forcing region classified according to sensing results of a first sense amplifier and a second sense amplifier.

FIG. 14 is a flowchart illustrating an example of a method of operating a semiconductor memory device.

FIG. 17 is an example of a table illustrating grouping operations by the sense amplifiers.

DETAILED DESCRIPTION

Hereinafter, example implementations will be described with reference to the accompanying drawings.

Figure 1:
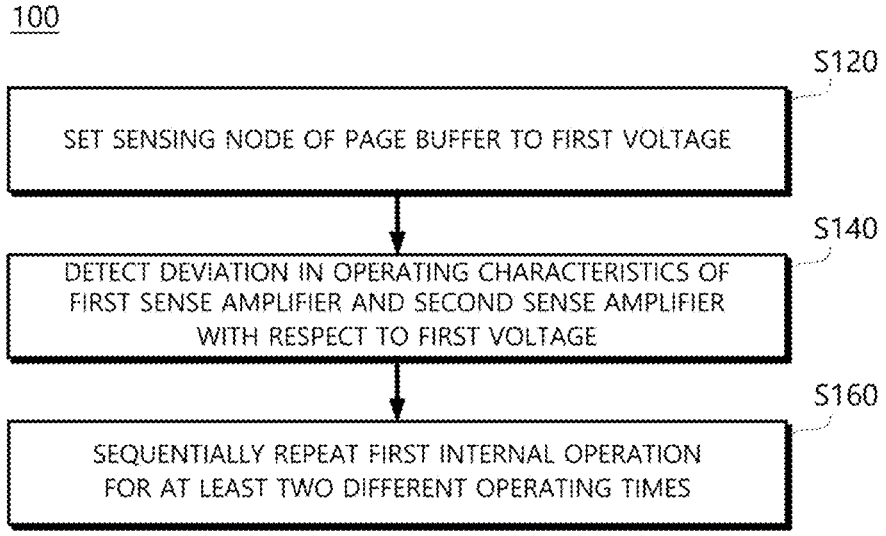
FIG. 1 is a flowchart illustrating an example of a method of operating a semiconductor memory device.
Figure 2:
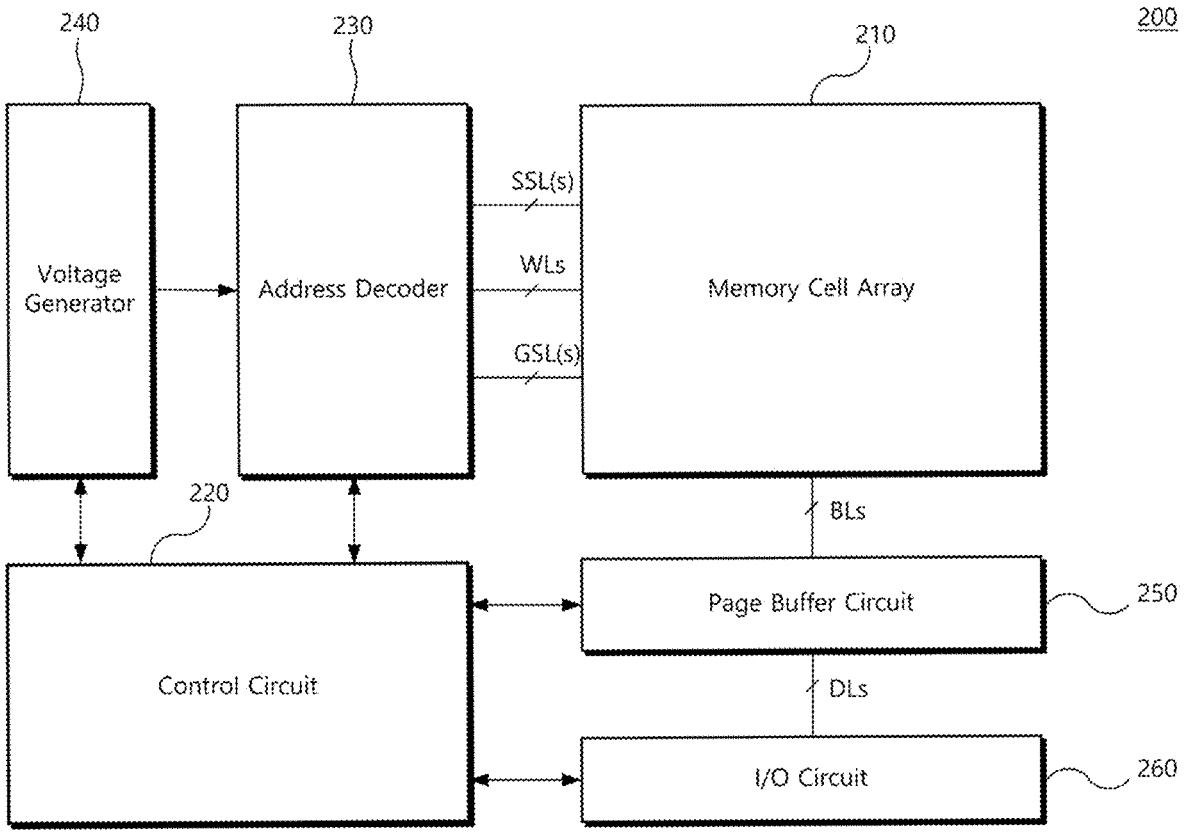
FIG. 2 illustrates an example of a semiconductor memory device.
Figure 3:
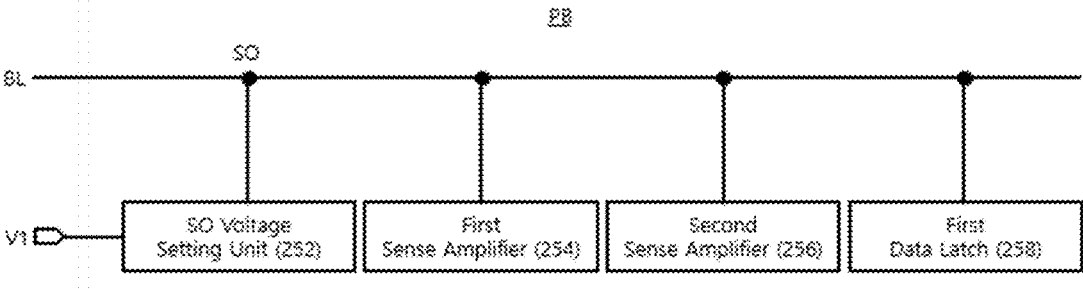
FIG. 3 illustrates an example of a page buffer.

FIG. 1 is a flowchart illustrating an example of a method 100 of operating a semiconductor memory device, FIG. 2 illustrates an example of a semiconductor memory device 200, and FIG. 3 illustrates an example of a page buffer (PB).

Referring to FIGS. 1 through 3, the method 100 of operating the semiconductor memory device 200 includes setting a sensing node SO of the PB to a first voltage V1 in operation S120, detecting a deviation in operating characteristics of a first sense amplifier 254 and a second sense amplifier 256 with respect to the first voltage V1 in operation S140, and sequentially repeating first internal operations for at least two different operating times in operation S160 in at least one of the first sense amplifier 254 and the second sense amplifier 256 based on the deviation in operating characteristics of the first sense amplifier 254 and the second sense amplifier 256.

The semiconductor memory device 200 may be embodied as a NAND flash memory device. However, the present disclosure is not limited thereto and the semiconductor memory device 200 may be embodied as a non-volatile memory device such as a Phase Change Random Access Memory (PRAM), a Resistance Random Access Memory (RRAM), a Magneto-resistive Random Access Memory (MRAM), or a Ferroelectric random access memory (FRAM).

The semiconductor memory device 200 may include a memory cell array 210, a control circuit 220, an address decoder 230, a voltage generator 240, a page buffer circuit 250, and a data input/output circuit 260.

The memory cell array 210 may include a plurality of memory cells (MCs) connected to a plurality of word lines (WLs) and a plurality of bit lines (BLs). For example, the memory cell array 210 may be a 3D memory cell array formed vertically on a substrate. Also, the memory cell array 210 may be a 2D memory cell array formed flat on a substrate.

The control circuit 220 may control erasing operation, program operation, and read operation of the semiconductor memory device 200 based on received command signal CMD and address signal ADDR. Verification on the erasing operation and the program operation of the semiconductor memory device 200 may also be controlled by the control circuit 220. For example, the control circuit 220 may generate a control signal XCON for controlling the voltage generator 240 and the page buffer circuit 250 based on the command signal CMD and may generate a row address R_ADDR and a column address C_ADDR based on the address signal ADDR. The row address R_ADDR may be transmitted to the address decoder 230 and the column address C_ADDR may be transmitted to the data input/output circuit 260.

The address decoder 230 may be connected to the memory cell array 210 through a plurality of string selection lines (SSLs), the plurality of WLs, and a plurality of ground selection lines (GSLs). While in the program operation or the read operation, the address decoder 230 may set one of the plurality of WLs as a select word line and the word line WL other than the select word line as a non-select word line based on the row address R_ADDR. Also, while in the program operation or the read operation, the address decoder 230 may set one of the plurality of SSLs as a select string selection line and the string selection line SSL other than the select string selection line as a non-select string selection line based on the row address R_ADDR. In addition, while in the program operation or the read operation, the address decoder 230 may set one of the plurality of GSLs as a select ground selection line and the ground selection line GSL other than the select ground selection line as a non-select ground selection line based on the row address R_ADDR.

The voltage generator 240 may generate an operating voltage Vop required to operate the semiconductor memory device 200 based on the control signal XCON received from the control circuit 220 and may apply the operating voltage Vop to the select word line from among the plurality of WLs through the address decoder 230. For example, the voltage generator 240 may generate a read voltage applied to the select word line and a read pass voltage applied to the non-select word line from among the plurality of WLs for the read operation. Also, the voltage generator 240 may generate a program voltage applied to the select word line and a program pass voltage applied to the non-select word line from among the plurality of WLs for the program operation. In addition, the voltage generator 240 may generate a program verification voltage applied to the select word line and a verify pass voltage applied to the non-select word line from among the plurality of WLs for the program verify operation.

The data input/output circuit 260 may receive program data PDTA which is to be programed in the memory cell array 210 and may output read data RDTA read from the memory cell array 210. The data input/output circuit 260 may transmit the program data PDTA to the page buffer circuit 250 through a data line DL that corresponds to the column address C_ADDR or may receive the read data RDTA from the page buffer circuit 250.

The page buffer circuit 250 may temporarily store to-be-programed data in a selected page of the memory cell array 210 during the program operation and may temporarily store data read from the selected page during the read operation. Also, the page buffer circuit 250 may sense voltages of a plurality of BLs connected to the memory cell array 210. The page buffer circuit 250 may include a plurality of PBs. For example, each PB may connect BL. Also, each PB may connect two or more BLs. The PB may sense voltages of connected BLs.

In this regard, each PB may include the first sense amplifier 254 and the second sense amplifier 256. The first sense amplifier 254 and the second sense amplifier 256 may respectively be connected to the sensing node SO located on an extension line of each BL. As the first sense amplifier 254 and the second sense amplifier 256 respectively sense the sensing node SO of each BL, the first sense amplifier 254 and the second sense amplifier 256 may amplify a voltage level of the BL to a signal in a recognizable logic level. The first sense amplifier 254 and the second sense amplifier 256 sense the sensing nodes SO for each different develop time in the same program verify operation and thereby, more accurate program operation may be performed as described below.

Figure 4:
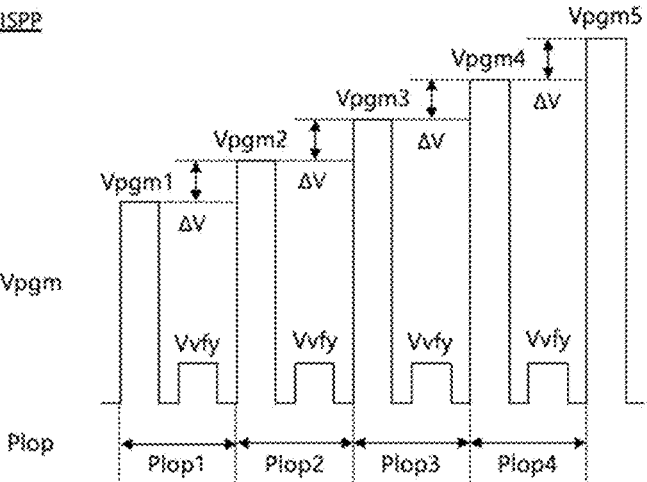
FIG. 4 illustrates an example of a program voltage and an example of a program verification voltage.

FIG. 4 illustrates an example of a program voltage Vpgm and an example of a program verification voltage Vvfy.

Referring to FIGS. 2 through 4, the semiconductor memory device 200 may execute a program for memory cells by using an Increment Step Pulse Program (ISPP). In this regard, the voltage generator 240 may generate the program voltage Vpgm including two or more program pulses Vpgm1 through Vpgm5 and the program verification voltage Vvfy corresponding to each of the program pulses Vpgm1 through Vpgm5 and may apply the program voltage Vpgm and the program verification voltage Vvfy to the corresponding WL. The program pulses Vpgm1 through Vpgm5 may be generated in such a way that each pulse gradually increases by a constant voltage difference ΔV. One program loop Plop may include one program pulse of the program voltage Vpgm and the corresponding program verification voltage Vvfy.

Figure 5A:
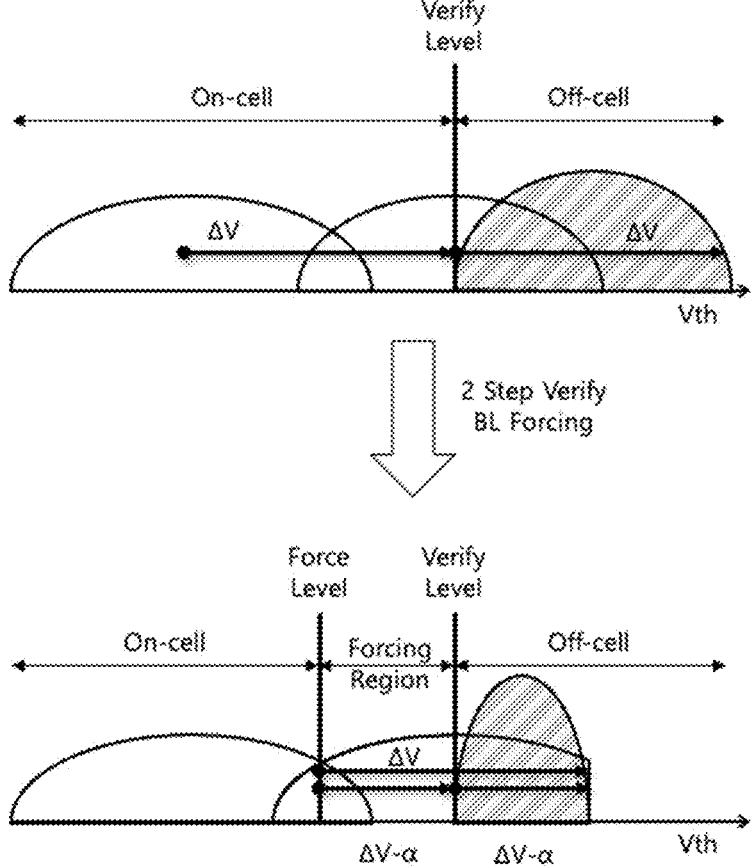
FIGS. 5A through 5C respectively illustrate example threshold voltage distribution of memory cells programed by an Increment Step Pulse Program (ISPP) of FIG. 4.
Figure 5B:
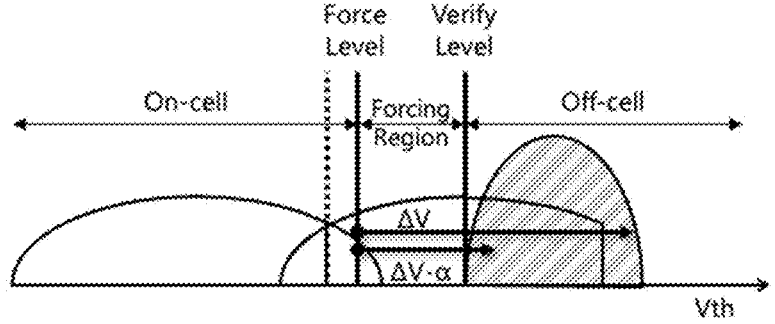
Figure 5C:
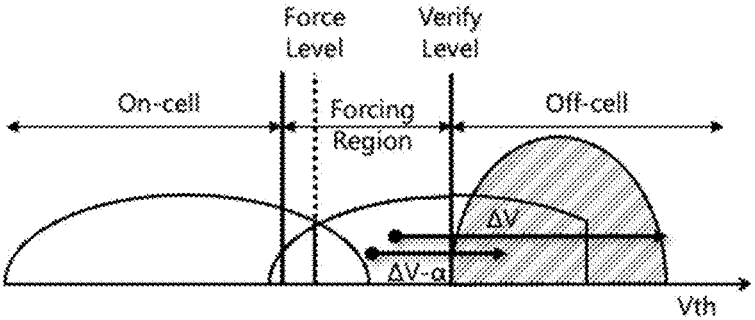

FIGS. 5A through 5C respectively illustrate example threshold voltage distribution of memory cells programed by the ISPP of FIG. 4.

First, referring to FIGS. 3 through 5A, the memory cell may have an arbitrary threshold voltage Vth after an arbitrary program pulse of the program voltage Vpgm is applied. As a succeeding operation for the corresponding memory cell varies according to the threshold voltage Vth, the corresponding memory cell may be classified into an on-cell and an off-cell by the verification operation using the program verification voltage Vvfy (refer to the upper view of FIG. 5A).

For example, the program operation which is a first program pulse Vpgm1 is performed at a first program loop Plop1 and then, the memory cell is verified as an on-cell. Here, a second program pulse Vpgm2 may be applied to a connected WL and a ground voltage may be applied to a connected BL at a succeeding operation, that is, a second program loop Plop2. On the other hand, in the memory cell which is verified as an off-cell after the program operation which is the first program pulse Vpgm1 is performed, the second program pulse Vpbm2 may be applied to the connected WL, however, a bit-line forcing voltage may be applied to the connected BL at the second program loop Plop2. The bit-line forcing voltage may be higher than a ground voltage and lower than a program inhibit voltage.

At each program loop Plop, at least two sensing operations are performed for the program verification voltage Vvfy in such a way that the develop time for the sensing nodes SO varies in the PB. Accordingly, a forcing region may be formed in the threshold voltage distribution of the memory cell (refer to lower view of FIG. 5A). The forcing region may be formed by the operation of the first sense amplifier 254 and the second sense amplifier 256.

In some implementations, a sensing operation for the sensing node SO is performed by the first sense amplifier 254 and the second sense amplifier 256 for each different develop time. For example, when the program verification voltage Vvfy is applied to the select word line from among the plurality of WLs, the first sense amplifier 254 and the second sense amplifier 256 may sequentially sense the sensing nodes SO to which a current of the BL connected to the corresponding memory cell from among the memory cells connected to the select word line. For example, after the sensing operation by the first sense amplifier 254 is performed, the sensing operation by the second sense amplifier 256 may be performed.

Here, while the first sense amplifier 254 and the second sense amplifier 256 sense the sensing nodes SO, the develop time for the sensing nodes SO varies and thus, the forcing region may be formed. For example, the develop time in the first sense amplifier 254 may be shorter than the develop time in the second sense amplifier 256.

The sensing operation of the first sense amplifier 254 may be referred to as a coarse sensing operation and the operation of the second sense amplifier 256 may be referred to as a fine sensing operation. That is, the program verify operation may include the coarse sensing operation performed by the first sense amplifier 254 and the fine sensing operation performed by the second sense amplifier 256. In this case, the first sense amplifier 254 may be referred to as a coarse sensing amplifier and the second sense amplifier 256 may be referred to as a fine sensing amplifier.

As described above, the forcing region may be formed in such way that the first sense amplifier 254 and the second sense amplifier 256 sense the sensing nodes SO for each different develop time with respect to the program verification voltage Vvfy. That is, the forcing region may be a region interposed between a force level by the first sense amplifier 254 and a verify level by the second sense amplifier 256. Accordingly, the forcing region includes a memory cell which is an off-cell verified as a result of coarse sensing performed by the first sense amplifier 254 and an on-cell verified as a result of fine sensing performed by the second sense amplifier 256.

For the memory cell included in the forcing region, a specific level between a power voltage and a ground voltage is forced to a bit line at a next program loop and a variation of the threshold voltage Vth in the corresponding memory cell may be adjusted. For example, the threshold voltage Vth of the memory cell included in the forcing region may be less than a variation corresponding to the voltage difference ΔV between each of the program pulses Vpgm1 through Vpgm5. For example, the threshold voltage Vth of the memory cell included in the forcing region may correspond to ½ of the voltage difference ΔV between each of the program pulses Vpgm1 through Vpgm5. Accordingly, a range of the threshold voltage distribution of the memory cell is decreased and thereby, more accurate program operation may be performed.

Referring to FIGS. 3, 4, 5B, and 5C, a characteristic deviation may exist in sensing operations performed by the first sense amplifier 254 and the second sense amplifier 256. In this case, a deviation may be generated in the forcing region set by the first sense amplifier 254 and the forcing region set by the second sense amplifier 256. The deviation of the forcing region may reduce the effect that may decrease the range of threshold voltage distribution by varying control for the memory cell included in the forcing region. The characteristic deviation of the sensing operations performed by the first sense amplifier 254 and the second sense amplifier 256 may be caused from a difference between a trip voltage of the first sense amplifier 254 and a trip voltage of the second sense amplifier 256.

Figure 6:
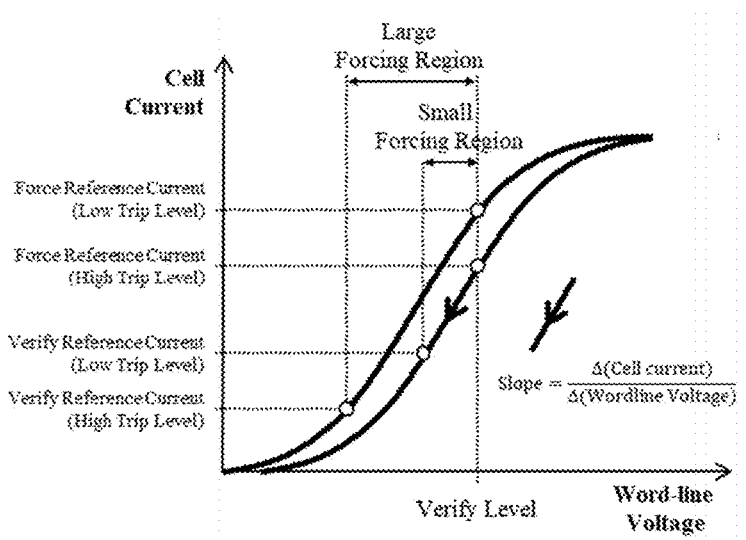
FIG. 6 illustrates example cell current characteristics due to a deviation in trip levels.

FIG. 6 illustrates example cell current characteristics due to a deviation in trip levels.

Referring to FIGS. 3 and 6, the forcing region varies according to a difference of a trip level in the coarse sensing and the fine sensing. The trip voltage denotes a standard for judging the on-cell and the off-cell in the first sense amplifier 254 and the second sense amplifier 256. For example, when a voltage of the sensing node SO is greater than a trip voltage, the corresponding memory cell is considered as the off-cell and when a voltage of the sensing node SO is lower than a trip voltage, the corresponding memory cell is considered as the on-cell.

According to the graph of FIG. 6, when a trip level of the coarse sensing is low and a trip level of the fine sensing is high, the forcing region is set to be wide. On the contrary to this, when a trip level of the coarse sensing is high and a trip level of the fine sensing is low, the forcing region is set to be narrow.

As described above, when a deviation of the forcing region exists between the sense amplifiers which perform the verification operation for the same program pulse at each difference voltage level, error may be generated. That is, as a degree of movements of the memory cell described in FIGS. 5A through 5C varies, inaccurate cell distribution may be formed and errors may be finally generated in program operations. For example, as vertical stacks of a V-NAND flash memory get higher, a variation of a cell current according to a voltage of the word line is reduced and a size of a transistor used in the PB for improving integration may be reduced. Accordingly, a probability that errors will be generated in detecting a threshold voltage of the memory cell by using a difference of the trip voltages in the first sense amplifier 254 and the second sense amplifier 256 may be increased.

Referring back to FIGS. 1 through 3, in the method 100 of operating the semiconductor memory device 200, the effect occurring due to an operating deviation between the first sense amplifier 254 and the second sense amplifier 256 included in the PB may be minimized while the verification operation is performed.

First, a sensing node voltage setting unit 252 may apply the first voltage V1 to the sensing node SO in order to identify whether an operating deviation exists between the first sense amplifier 254 and the second sense amplifier 256

(operation S120). For example, the first voltage V1 of 0V through 2V, which is an analog voltage, may be applied to the sensing node voltage setting unit 252. For example, when the trip voltages of the first sense amplifier 254 and the second sense amplifier 256 are about 0.6V through 0.8V, the first voltage V1 of about 0.7V may be applied to the sensing node voltage setting unit 252.

Figure 7A:
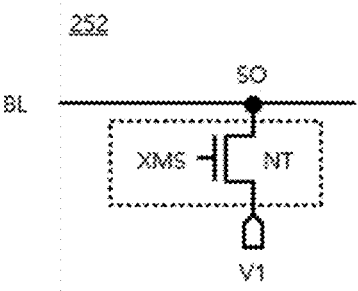
FIGS. 7A through 7C respectively illustrate an example of a sensing node voltage setting unit.
Figure 7B:
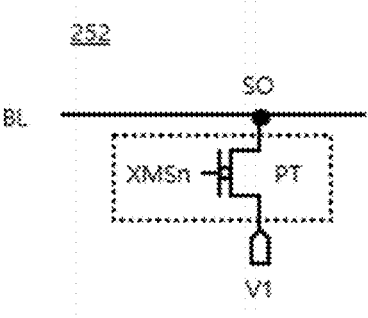
Figure 7C:
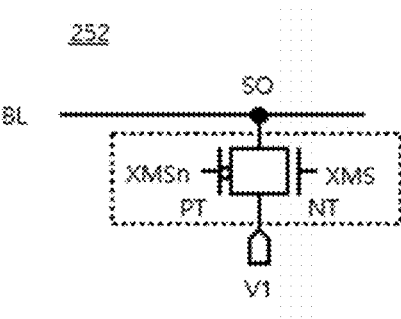

FIGS. 7A through 7C respectively illustrate an example of the sensing node voltage setting unit 252.

First, referring to FIGS. 3 and 7A, the sensing node voltage setting unit 252 may include an NMOS transistor NT including one end connected to the sensing node SO and the other end to which the first voltage V1 is applied. For example, when the trip voltages of the first sense amplifier 254 and the second sense amplifier 256 are low (for example, below 0.7V), the sensing node voltage setting unit 252 may include the NMOS transistor NT. When the NMOS transistor NT is turned on in response to a measurement signal XMS, the first voltage V1 may be applied to the sensing node SO.

Next, referring to FIGS. 3 and 7B, the sensing node voltage setting unit 252 may include a PMOS transistor PT including one end connected to the sensing node SO and the other end to which the first voltage V1 is applied. For example, when the trip voltages of the first sense amplifier 254 and the second sense amplifier 256 are high (for example, above 1.3V), the sensing node voltage setting unit 252 may include the PMOS transistor PT. When the PMOS transistor PT is turned on in response to an inverted measurement signal XMSn, the first voltage V1 may be applied to the sensing node SO.

Next, referring to FIGS. 3 and 7C, the sensing node voltage setting unit 252 may include the NMOS transistor NT and the PMOS transistor PT connected to each other in parallel and each including one end connected to the sensing node SO and the other end to which the first voltage V1 is applied. For example, when the trip voltages of the first sense amplifier 254 and the second sense amplifier 256 are median voltages (for example, 0.7V through 1.3V), the sensing node voltage setting unit 252 may include the NMOS transistor NT and the PMOS transistor PT. When the NMOS transistor NT is turned on in response to the measurement signal XMS or the PMOS transistor PT is turned on in response to the inverted measurement signal XMSn, the first voltage V1 may be applied to the sensing node SO.

Figure 8:
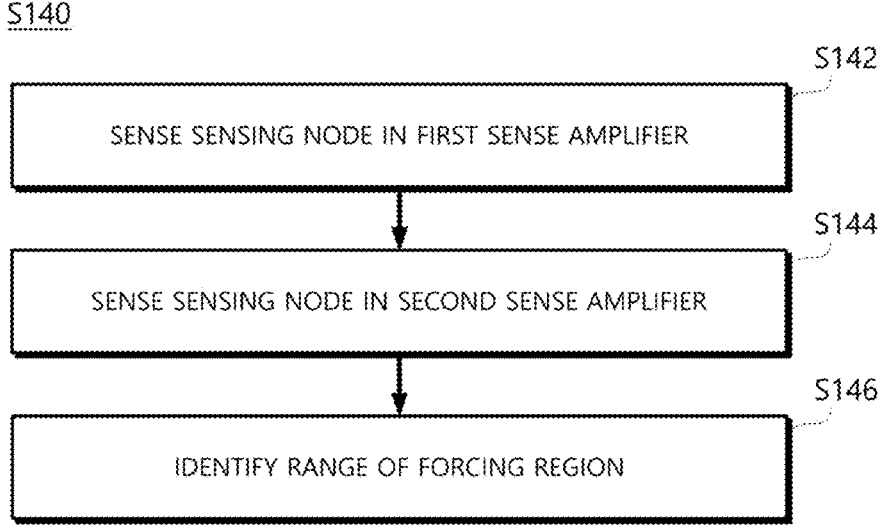
FIG. 8 is an example of a flowchart illustrating detecting of a deviation in operating characteristics of a first sense amplifier and a second sense amplifier.

FIG. 8 is an example of a flowchart illustrating detecting of a deviation in operating characteristics of the first sense amplifier 254 and the second sense amplifier 256 (operation S140).

Referring to FIGS. 3 and 8, detecting of a deviation in operating characteristics of the first sense amplifier 254 and the second sense amplifier 256 (operation S140) may include sensing the sensing node SO in the first sense amplifier 254 in operation S142, sensing the sensing node SO in the second sense amplifier 256 in operation S144, and identifying a range of the forcing region corresponding to the first sense amplifier 254 and the second sense amplifier 256 based on the sensing results of the first sense amplifier 254 and the second sense amplifier 256 in operation S146. Sensing the sensing node SO in the first sense amplifier 254 in operation S142 and sensing the sensing node SO in the second sense amplifier 256 in operation S144 may be simultaneously performed.

FIGS. 9A and 9B respectively illustrate the example sensing results of the first sense amplifier 254 and the second sense amplifier 256, and FIG. 10 is an example of a table illustrating a range of the forcing region classified according to the sensing results of the first sense amplifier 254 and the second sense amplifier 256.

Referring to FIGS. 3, 9A, 9B, and 10, the sensing result of the first sense amplifier 254 and the sensing result of the second sense amplifier 256 may vary according to a deviation of the trip voltages in each sense amplifier. In other words, the sensing result of the first sense amplifier 254 and the sensing result of the second sense amplifier 256 may correspond to a deviation of the trip voltages in the first sense amplifier 254 and the second sense amplifier 256 and thereby, may be the same or different from each other.

If it is assumed that the first voltage V1 is 0.7V and initial values of the first sense amplifier 254 and the second sense amplifier 256 are set as logic low "L" and when the trip voltages of the first sense amplifier 254 and the second sense amplifier 256 are respectively 0.75V, the sensing results of the first sense amplifier 254 and the second sense amplifier 256 may be respectively generated as logic high "H". Also, when the trip voltages of the first sense amplifier 254 and the second sense amplifier 256 are respectively 0.65V, the sensing results of the first sense amplifier 254 and the second sense amplifier 256 may be respectively maintained as a logic low "L" which is an initial value.

That is, even if a deviation in operating characteristics of the first sense amplifier 254 and the second sense amplifier 256 does not exist, the sensing results of the first sense amplifier 254 and the second sense amplifier 256 may be indicated as the same logic level. When the sensing results of the first sense amplifier 254 and the second sense amplifier 256 are in the same logic level, the range of the forcing region may be classified as a default by the PB including the first sense amplifier 254 and the second sense amplifier 256.

On the other hand, if a deviation in operating characteristics of the first sense amplifier 254 and the second sense amplifier 256 exists, the sensing results of the first sense amplifier 254 and the second sense amplifier 256 may be indicated as each different logic level. For example, when the trip voltage of the first sense amplifier 254 is 0.75V and the trip voltage of the second sense amplifier 256 is 0.65V, the sensing result of the first sense amplifier 254 may be generated as logic high "H" and the sensing result of the second sense amplifier 256 may be maintained as logic low "L". Also, when the trip voltage of the first sense amplifier 254 is 0.65V and the trip voltage of the second sense amplifier 256 is 0.75V, the sensing result of the first sense amplifier 254 may be maintained as logic low "L" and the sensing result of the second sense amplifier 256 may be generated as logic high "H". Here, this denotes that when the first voltage V1 of the sensing node SO is higher than the trip voltages of the first sense amplifier 254 and the second sense amplifier 256 in a first data latch 258, which will be described later, the stored first value is changed, and when the first voltage V1 of the sensing node SO is lower than the trip voltages of the first sense amplifier 254 and the second sense amplifier 256, the first value is maintained.

When the sensing results of the first sense amplifier 254 and the second sense amplifier 256 are in each different logic level, the range of the forcing region by the PB including the first sense amplifier 254 and the second sense amplifier 256 may be classified as to be wide or narrow. For example, when the sensing result of the first sense amplifier 254 is logic high "H" and the sensing result of the second sense amplifier 256 is logic low "L", the range of the forcing region by the corresponding PB may be classified as to be narrow. On the other hand, when the sensing result of the first sense amplifier 254 is logic low "L" and the sensing result of the second sense amplifier 256 is logic high "H", the range of the forcing region by the corresponding PB may be classified as to be wide.

The first voltage V1 of the first sense amplifier 254 and the first voltage V1 of the second sense amplifier 256 may be set to have each different voltage level.

Referring back to FIGS. 1 through 4, when a deviation in operating characteristics of the first sense amplifier 254 and the second sense amplifier 256 is detected in operation S140, first internal operations is sequentially repeated for at least two different operating times in at least one of the first sense amplifier 254 and the second sense amplifier 256 in operation S160. For example, at least one of the first sense amplifier 254 and the second sense amplifier 256 may perform the first internal operations twice for one program verification voltage Vvfy, wherein each of the first internal operations may be operated for each different operating time. For example, the first sense amplifier 254 may repeatedly sense the sensing node SO for the first program verification voltage Vvfy1 and the second sense amplifier 256 may repeatedly sense the sensing node SO for the second program verification voltage Vvfy2.

The first internal operations may be one of the internal operations included in the program verify operation.

Figure 11:
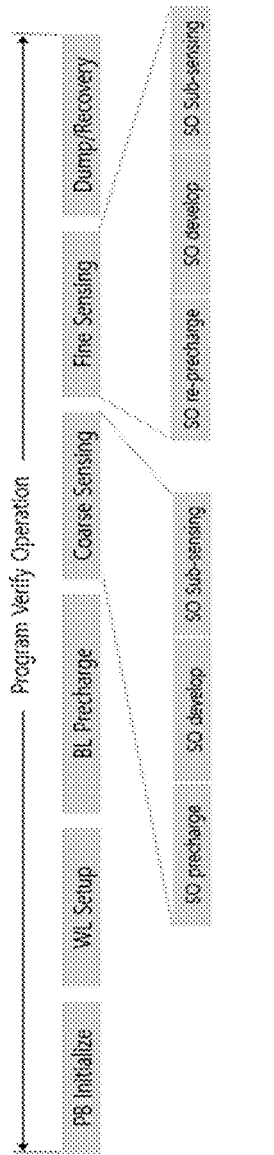
FIG. 11 illustrates example internal operations of a program verify operation.

FIG. 11 illustrates the example internal operations of the program verify operation.

Referring to FIGS. 1, 2, and 11, the program verify operation may include a plurality of internal operations. For example, the program verify operation may include a page buffer initialize operation, a setup operation for the select word line from among the plurality of WLs, a coarse sensing operation, a fine sensing operation, and a dump/recovery operation.

For example, setting the sensing node SO of the PB to the first voltage V1 in operation S120 and detecting a deviation in operating characteristics of the first sense amplifier 254 and the second sense amplifier 256 in operation S140 may be performed in the setup operation for the select word line. However, the present disclosure is not limited thereto.

Also, in the coarse sensing operation, a precharge operation for the sensing node SO, a develop operation for the sensing node SO, and a sub-sensing operation for the sensing node SO may be performed. In the fine sensing operation, a re-precharge operation for the sensing node SO, a develop operation for the sensing node SO, and a sub-sensing operation for the sensing node SO may be performed. As described above, the coarse sensing operation may be performed in the first sense amplifier 254 and the fine sensing operation may be performed in the second sense amplifier 256.

Here, the first internal operation may be the develop operation for the sensing node SO by the first sense amplifier 254 or the second sense amplifier 256. Hereinafter, for convenience of description, it will be described that the first internal operation is the develop operation for the sensing node SO. However, the present disclosure is not limited thereto.

Figure 12:
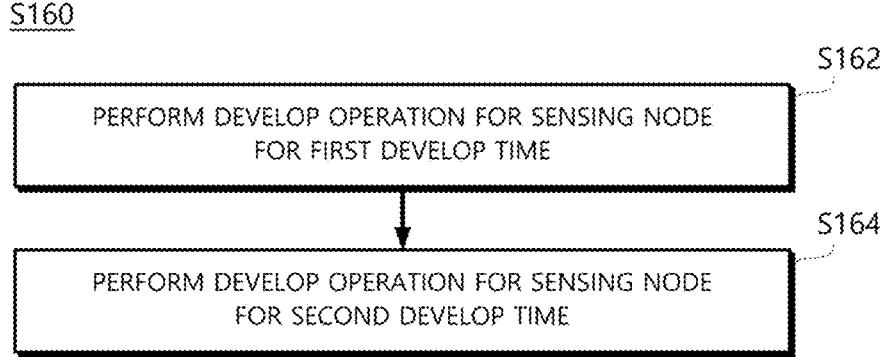
FIG. 12 is an example of a flowchart illustrating sequentially repeating of first internal operations.
Figure 13:
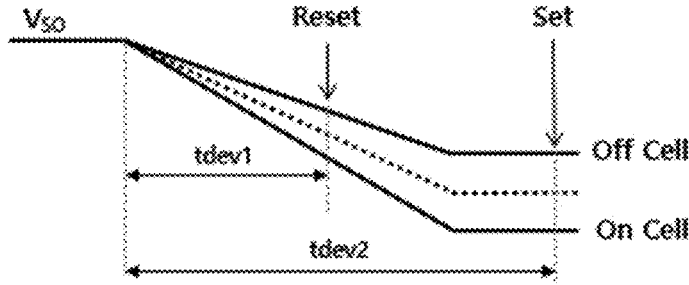
FIG. 13 is an example of a graph illustrating each different develop time of FIG. 12.

FIG. 12 is an example of a flowchart illustrating sequentially repeating of the first internal operations in operation S160, and FIG. 13 is an example of a graph illustrating each different develop time of FIG. 12.

Referring to FIGS. 3, 12, and 13, sequentially repeating of the first internal operations in operation S160 may include performing the develop operation for the sensing node SO for a first develop time tdev1 in the first sense amplifier 254 in operation S162, and performing the develop operation for the sensing node SO for a second develop time tdev2, which is different from the first develop time tdev1, in the first sense amplifier 254 in operation S164.

Sequentially repeating of the first internal operations in operation S160 may be performed in the second sense amplifier 256 or both first sense amplifier 254 and second sense amplifier 256. The coarse sensing operation by the first sense amplifier 254 may have a higher sensing margin than that of the fine sensing operation by the second sense amplifier 256 and thereby, it may be easy to control the first sense amplifier 254. On the other hand, when the operating control of the second sense amplifier is also easy and improvement of the threshold voltage distribution is further required, the develop operation may be repeatedly performed by the second sense amplifier 256 or both first sense amplifier 254 the second sense amplifier 256. However, hereinafter, for convenience of description, the first sense amplifier 254 will be described only.

For example, when the range of the forcing region is classified as to be narrow by an operating deviation of the first sense amplifier 254 and the second sense amplifier 256, the develop operation for the first develop time tdev1, which is shorter than the second develop time dev2, may be additionally performed. When the sensing node SO is sensed for the first develop time tdev1, which is shorter than the second develop time tdev2, the off-cell may be more sensed than the case when the sensing node SO is sensed for the second develop time tdev2. Accordingly, as illustrated in FIG. 5B, while the range of the forcing region is narrow, the off-cell may be more sensed.

For reasons mentioned above, when the range of the forcing region is classified as to be wide by an operating deviation of the first sense amplifier 254 and the second sense amplifier 256, the develop operation for the second develop time tdev2, which is longer than the first develop time dev1, may be additionally performed. When the sensing node SO is sensed for the second develop time tdev2, which is longer than the first develop time tdev1, the on-cell may be more sensed than the case when the sensing node SO is sensed for the first develop time tdev1. Accordingly, as illustrated in FIG. 5C, while the range of the forcing region is wide, the on-cell may be more sensed.

As in the above-described implementations, in response to the case when the range of the forcing region is wide or narrow according to an operating deviation of the first sense amplifier 254 and the second sense amplifier 256 included in one PB, the develop time varies in the first sense amplifier 254 and the sensing operation is performed twice. Accordingly, the effect due to a deviation of the forcing region may be offset. In this regard, more detailed threshold voltage distribution may be formed and thereby, accurate program operation may be performed.

FIG. 14 is a flowchart illustrating an example of the method 100 of operating the semiconductor memory device 200.

Referring to FIGS. 3 and 14, as illustrated in FIG. 1, the method 100 of operating the semiconductor memory device 200 includes setting the sensing node SO of the PB to the first voltage V1 in operation S120, detecting a deviation in operating characteristics of the first sense amplifier 254 and the second sense amplifier 256 with respect to the first voltage V1 in operation S140, and sequentially repeating the first internal operations for at least two different operating times in operation S160 in at least one of the first sense amplifier 254 and the second sense amplifier 256 based on the deviation in operating characteristics of the first sense amplifier 254 and the second sense amplifier 256. In addition, the method 100 of FIG. 14 may further include generating a first value corresponding to the deviation in operating characteristics of the first sense amplifier 254 and the second sense amplifier 256 in operation S150 and invalidating the result of at least one first internal operation from among the first internal operations repeatedly performed based on the first value in operation S170.

The first data latch 258 of the PB may store the first value. For example, when the sensing result of the first sense amplifier 254 is logic high "H" and the sensing result of the second sense amplifier 256 is logic low "L", the first data latch 258 may have the first value which is logic high "H". Here, when the sensing results of both first sense amplifier 254 and second sense amplifier 256 are logic high "H" or logic low "L", or when the sensing result of the first sense amplifier 254 is logic low "L" and the sensing result of the second sense amplifier 256 is logic high "H", the first data latch 258 may have the first value which is logic low "L".

For example, when the sensing result of the first sense amplifier 254 is logic low "L" and the sensing result of the second sense amplifier 256 is logic high "H", the first data latch 258 may have the first value which is logic high "H". Here, when the sensing results of both first sense amplifier 254 and second sense amplifier 256 are logic high "H" or logic low "L", or when the sensing result of the first sense amplifier 254 is logic high "H" and the sensing result of the second sense amplifier 256 is logic low "L", the first data latch 258 may store the first value which is logic low "L". In addition, two first data latches 258 may be prepared and thereby, there may be 4 cases of combinations of sensing results of the first sense amplifier 254 and the second sense amplifier 256. Each of the combinations may be separately stored as the first value.

The first sense amplifier 254 and the second sense amplifier 256 in each PB may be each grouped by using the method described above. The grouping operation may be performed at a production stage of the semiconductor memory device 200 or at an initial stage where the semiconductor memory device 200 is turned on. However, according to the need, the grouping operation may be additionally performed at an idle time of the semiconductor memory device 200 and thereby, the first value of the first data latch 258 may be updated.

Figures 15, 16:
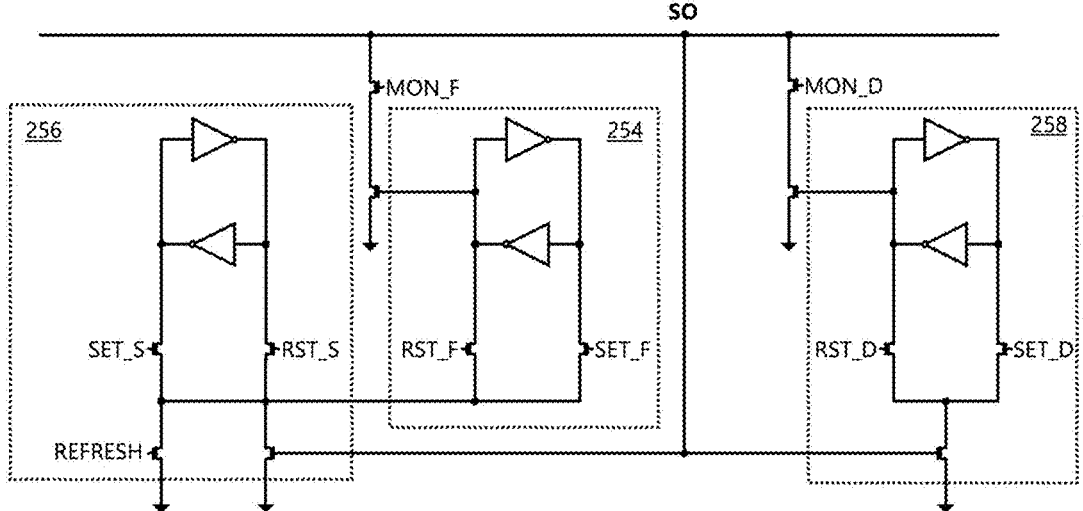
FIG. 15 illustrates an example of a part of the page buffer.
FIG. 16 is an example of a table illustrating invalidating of a result of at least one first internal operation of FIG. 14.

FIG. 15 illustrates an example of a part of the PB, and FIG. 16 is an example of a table illustrating invalidating of a result of at least one first internal operation in operation S170 of FIG. 14.

Referring to FIGS. 3 and 13 through 16, the first sense amplifier 254, the second sense amplifier 256, and the first data latch 258 of the PB may each include a pair of inverters and a pair of transistors which is turned on by one of a set signal SET and a reset signal RST. The second sense amplifier 256 may further include a transistor including a gate to which a refresh signal REFRESH is applied, and one end connected to the first sense amplifier 254. Each of the second sense amplifier 256 and the first data latch 258 may further include a transistor including a gate connected to the sensing node SO and one end connected to the first sense amplifier 254. Also, the PB may further include monitoring transistors MON_F and MON_D for monitoring condition of the first sense amplifier 254 and the first data latch 258.

As described above, the first sense amplifier 254 may repeatedly perform the sensing operation for the sensing node SO. That is, the first sense amplifier 254 may perform a primary develop operation for the sensing node SO for the first develop time tdev1 (reset sensing) and may perform a secondary develop operation for the sensing node SO for the second develop time tdev2 (set sensing).

When the first value stored by the first data latch 258 is logic high "H", a control for the forcing region needs to be performed due to an operating deviation of the first sense amplifier 254 and the second sense amplifier 256. For example, when a voltage of the sensing node SO is greater than a voltage of the first sense amplifier 254 or a voltage of the second sense amplifier 256 and when the memory cell connected to the sensing node SO is the off-cell, the off-cell may be sensed as, for example, logic low "L", as a result of sensing for the first develop time tdev1. On the other hand, when the memory cell connected to the sensing node SO is the on-cell, the on-cell may be sensed as, for example, logic high "H", as a result of sensing for the first develop time tdev1.

This may be set as an inverted value through the invalidating of the result of at least one first internal operation in operation S170. The invalidating of the result of the first internal operation in operation S170 may be referred to as a data processing operation. That is, a sensing node voltage Vso of the sensing node SO may be changed into an inverted level. Then, the first sense amplifier 254 performs the develop operation for the second develop time tdev2 and consequently, the off-cell and the on-cell may be sensed into an original logic level.

When the first value stored by the first data latch 258 is logic low "L", a control for the forcing region is not required as an operating deviation of the first sense amplifier 254 and the second sense amplifier 256 does not exist. When the memory cell connected to the sensing node SO is both off-cell and on-cell, the off-cell and the on-cell may be sensed as, for example, logic low "L", as a result of sensing for the first develop time tdev1. Then, the first sense amplifier 254 performs the develop operation for the second develop time tdev2 and the sensing node voltage Vso of the sensing node SO for the off-cell may be changed into an inverted level.

FIG. 17 is an example of a table illustrating grouping operations by the sense amplifiers.

Referring to FIGS. 3 and 17, the sensing operation may be performed twice in such a way that the develop time varies in the first sense amplifier 254 according to the range of each forcing region. Here, when one first data latch 258 is prepared, grouping may be performed for one of the cases when the forcing region is wide and when the forcing region is narrow. On the other hand, when 2 first data latches 258 are prepared, a separate control may be performed for each case.

In the example semiconductor memory device and the example method of operating the same, the effect occurring due to an operating deviation between the sense amplifiers may be minimized so that accurate operations may be performed.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially be claimed as such, one or more features from a claimed combination can in some cases be excised from the combination, and the claimed combination may be directed to a subcombination or variation of a subcombination.

Hereinafter, although the concepts disclosed herein have been described in detail, those of ordinary skill in the art to which the present disclosure pertains will understand that various modifications are capable of being made to the above-described implementations without departing from the scope the present disclosure. Therefore, the scope of the present disclosure should not be limited to the described implementations, but it should be defined by not only the claims described below, but also the claims and equivalents.

What is claimed is:

1. A method of operating a semiconductor memory device, comprising:

setting a sensing node of a page buffer to a first voltage;

detecting a deviation in operating characteristics of a first sense amplifier and a second sense amplifier with respect to the first voltage based on a first sensing result and a second sensing result; and sequentially repeating a first internal operation for at least two different operating times in the first sense amplifier, the second sense amplifier, or both the first sense amplifier and the second sense amplifier based on the deviation in operating characteristics of the first sense amplifier and the second sense amplifier, wherein detecting the deviation in operating characteristics of the first sense amplifier and the second sense amplifier comprises:

sensing the sensing node in the first sense amplifier to obtain the first sensing result; and sensing the sensing node in the second sense amplifier to obtain the second sensing result, wherein sensing the sensing node in the second sense amplifier and sensing the sensing node in the first sense amplifier are performed at a same time.

2. The method of claim 1, wherein detecting the deviation in operating characteristics of the first sense amplifier and the second sense amplifier comprises:

identifying a range of a forcing region corresponding to a difference between a first verify voltage corresponding to the first sense amplifier and a second verify voltage corresponding to the second sense amplifier based on the first sensing result and the second sensing result.

3. The method of claim 2, wherein the first sensing result and the second sensing result correspond to a deviation of a trip voltage in the first sense amplifier and a trip voltage in the second sense amplifier.

4. The method of claim 1, wherein the first internal operation is a develop operation for the sensing node.

5. The method of claim 4, wherein sequentially repeating the first internal operation comprises:

performing the develop operation for the sensing node for a first develop time in the first sense amplifier; and performing the develop operation for the sensing node for a second develop time, which is different from the first develop time, in the first sense amplifier.

6. The method of claim 1, wherein sequentially repeating the first internal operation comprises a coarse sensing operation performed by the first sense amplifier and a fine sensing operation performed by the second sense amplifier.

7. The method of claim 1, further comprising:

generating a first value corresponding to the deviation in operating characteristics of the first sense amplifier and the second sense amplifier; and invalidating a result of at least one first internal operation from among the first internal operations repeatedly performed based on the first value.

8. The method of claim 1, wherein setting the sensing node of the page buffer to the first voltage and detecting the deviation in operating characteristics of the first sense amplifier and the second sense amplifier are performed in a word-line setup operation included in a program verify operation for verifying program condition of a memory cell electrically connected to the sensing node.

9. The method of claim 1, further comprising performing a program operation for a memory cell electrically connected to the sensing node by varying a bit-line voltage according to a result obtained from sequentially repeating the first internal operation.

10. A method of operating a semiconductor memory device, comprising:

performing a program operation for a memory cell using a plurality of program pulses;

performing a program verify operation which verifies a result of the program operation that has been performed using one of the plurality of program pulses by sequentially sensing a sensing node included in a page buffer and electrically connected to the memory cell at least 3 times through a coarse sensing amplifier and a fine sensing amplifier; and setting different sensing operation times for the sensing node based on a difference between a trip voltage of the coarse sensing amplifier and a trip voltage of the fine sensing amplifier, before the program verify operation is performed.

11. The method of claim 10, wherein setting the different sensing operation times comprises:

measuring the trip voltage of the coarse sensing amplifier and the trip voltage of the fine sensing amplifier to obtain measurement results;

grouping the coarse sensing amplifier and the fine sensing amplifier based on the measurement results to obtain a grouping result; and varying a develop time for the sensing node in a sensing operation performed at least twice by the coarse sensing amplifier based on the grouping result.

12. The method of claim 11, wherein measuring the trip voltage of the coarse sensing amplifier and the trip voltage of the fine sensing amplifier comprises:

setting the sensing node to a first voltage; and sensing the sensing node through the coarse sensing amplifier and through the fine sensing amplifier.

13. The method of claim 11, wherein performing the program verify operation comprises:

performing a first sensing operation for the sensing node for a first develop time by the coarse sensing amplifier; and performing a second sensing operation for the sensing node for a second develop time by the coarse sensing amplifier.

14. The method of claim 11, wherein grouping the coarse sensing amplifier and the fine sensing amplifier comprises setting an identification value for the coarse sensing amplifier and the fine sensing amplifier, wherein a range of a forcing region corresponding to a difference in the trip voltages of the coarse sensing amplifier and the fine sensing amplifier is classified as a first value.

15. The method of claim 11, wherein performing the program verify operation further comprises processing a sensing result value for the sensing node based on the grouping result.

16. The method of claim 15, wherein performing the program verify operation comprises:

performing a first sensing operation for the sensing node for a first develop time by the coarse sensing amplifier;

changing a voltage level of the sensing node; and performing a second sensing operation for the sensing node having a changed voltage level for a second develop time by the coarse sensing amplifier.

17. A semiconductor memory device comprising a page buffer, wherein the page buffer comprises:

a sensing node voltage setting circuit configured to apply a first voltage to a sensing node;

a coarse sensing amplifier configured to sense the sensing node at the first voltage and to output a first sensing result based on sensing the sensing node at the first voltage;

a fine sensing amplifier configured to sense the sensing node at the first voltage and to output a second sensing result based on the sensing node at the first voltage; and a first data latch configured to store a first value corresponding to the first sensing result and the second sensing result, wherein sensing the sensing node in the fine sensing amplifier and sensing the sensing node in the coarse sensing amplifier are performed at a same time.

18. The semiconductor memory device of claim 17, wherein the sensing node voltage setting circuit comprises a voltage transistor comprising one end connected to the sensing node and the other end to which the first voltage is applied.

19. The semiconductor memory device of claim 17, wherein the first data latch comprises:

a first transistor comprising a gate connected to the sensing node and one end connected to a first node;

a second transistor comprising one end connected to the first node and a gate to which an initial value is applied;

a third transistor which is connected between the first node and a second node and comprises a gate to which a set signal is applied;

a fourth transistor which is connected between the first node and a third node and comprises a gate to which a reset signal is applied; and a pair of inverters in which each of inputs and outputs are connected to each other in the second node and the third node.

\* \* \* \* \*